United States Patent
Ito et al.

(10) Patent No.: US 10,810,111 B2
(45) Date of Patent: Oct. 20, 2020

(54) COMPUTER SYSTEM, TEST METHOD, AND RECORDING MEDIUM

(71) Applicant: HITACHI AUTOMOTIVE SYSTEMS, LTD., Ibaraki (JP)

(72) Inventors: Yasuhiro Ito, Tokyo (JP); Yasuo Sugure, Tokyo (JP)

(73) Assignee: HITACHI AUTOMOTIVE SYSTEMS, LTD., Ibaraki (JP)

(*) Notice: Subject to any disclaimer, the term of this patent is extended or adjusted under 35 U.S.C. 154(b) by 0 days.

(21) Appl. No.: 16/342,308

(22) PCT Filed: Nov. 2, 2016

(86) PCT No.: PCT/IB2016/001882
§ 371 (c)(1),
(2) Date: Apr. 16, 2019

(87) PCT Pub. No.: WO2018/083515
PCT Pub. Date: May 11, 2018

(65) Prior Publication Data
US 2019/0251017 A1    Aug. 15, 2019

(51) Int. Cl.
*G06F 9/44* (2018.01)
*G06F 11/36* (2006.01)
(Continued)

(52) U.S. Cl.
CPC ....... *G06F 11/3664* (2013.01); *G01M 17/007* (2013.01); *G05B 23/0205* (2013.01);
(Continued)

(58) Field of Classification Search
CPC ............... G06F 11/3684; G06F 11/261; G06F 11/3672; G06F 30/20; G06F 8/10
See application file for complete search history.

(56) References Cited

U.S. PATENT DOCUMENTS 5,542,043 A    7/1996   Cohen et al.
5,673,387 A *  9/1997   Chen ................... G06F 11/3676
                                            714/38.1
(Continued)

FOREIGN PATENT DOCUMENTS

EP    0786110 A1    7/1997
JP    9-511853 A    11/1997
(Continued)

OTHER PUBLICATIONS

Yoshinobu,Apr. 7, 2013,translated WIPO 2013099438 (source globaldossier), pp. 17 (Year: 2013).*

(Continued)

*Primary Examiner* — Duy Khuong T Nguyen
(74) *Attorney, Agent, or Firm* — Mattingly & Malur, PC

(57) ABSTRACT

A processor acquires a plurality of test items for a simulation model of a target system, each test item including at least one event; detects a set of test items from the plurality of test items under an aggregation condition in which an event in the set is not dependent on an event in another test item in the set; includes a common event, which is an event in the set that is the same as an event in another test item in the set, in an aggregate test item while avoiding overlapping of the common event, and includes a unique event, which is an event in the set that differs from events in other test items in the set, in the aggregate test item; and executes a simulation using the simulation model in accordance with the aggregate test item.

13 Claims, 8 Drawing Sheets

(51) Int. Cl.
  *G06F 11/26* (2006.01)
  *G06F 30/20* (2020.01)
  *G01M 17/007* (2006.01)
  *G05B 23/02* (2006.01)
(52) U.S. Cl.
  CPC ........ *G06F 11/261* (2013.01); *G06F 11/3668* (2013.01); *G06F 11/3684* (2013.01); *G06F 30/20* (2020.01); *G05B 23/0256* (2013.01)

(56) References Cited

U.S. PATENT DOCUMENTS

| | | | | |
|---|---|---|---|---|
| 5,778,169 | A | * | 7/1998 | Reinhardt ........... G06F 11/3696 714/38.1 |
| 2005/0283664 | A1 | * | 12/2005 | Coulter, Jr. ........... G06F 11/263 714/15 |
| 2008/0109475 | A1 | | 5/2008 | Burmester et al. |
| 2009/0119542 | A1 | * | 5/2009 | Nagashima ........... G06F 11/261 714/33 |
| 2013/0185034 | A1 | * | 7/2013 | Murase ................ G06F 11/261 703/2 |

FOREIGN PATENT DOCUMENTS

| | | |
|---|---|---|
| JP | 10-275094 A | 10/1998 |
| JP | 2001-51864 A | 2/2001 |
| JP | 2009-193488 A | 8/2009 |
| WO | 2013/099438 A1 | 7/2013 |

OTHER PUBLICATIONS

Japanese Office Action received in corresponding Japanese Application No. 2019-517346 dated Mar. 10, 2020.
International Search Report of PCT/IB2016/001882 dated Jul. 28, 2017.

* cited by examiner

| Trigger item | | | Operation item | | | | | | Observation item | | | |
|---|---|---|---|---|---|---|---|---|---|---|---|---|
| Indication | Configuration value | Condition | Indication | Configuration value 1 | Configuration value 2 | Configuration value 3 | Configuration value 4 | Indication | Configuration value 1 | Configuration value 2 | Configuration value 3 | Condition |
| Wait time | 0 | | Write memory | CORE | INIT | 0xFFFF | 4 | Nop | | | | |
| | | | Write memory | FLASH/las_L5 | 4 | 0 | 1 | Nop | | | | |
| | | | Write memory | FLASH/las_L5 | 5 | 0 | 1 | Nop | | | | |
| | | | Write memory | FLASH/las_L5 | 6 | 0 | 1 | Nop | | | | |
| | | | Write memory | FLASH/las_L5 | 7 | 0 | 1 | Nop | | | | |
| Function Trigger | start_up | | Write memory | ADC_1/CWSEL0/WSEL CH7 | 0xF | | | Read memory | CORE | vIGN | 1 | |
| 511 | 512 | 513 | 521 | 522 | 522 | 522 | 522 | 531 | 532 | 532 | 532 | 533 |
| | 510 | | | | 520 | | | | | 530 | | |

321q

| Trigger item | | | Operation item | | | | | | Observation item | | | |
|---|---|---|---|---|---|---|---|---|---|---|---|---|
| Indication | Configuration value | Condition | Indication | Configuration value 1 | Configuration value 2 | Configuration value 3 | Configuration value 4 | Indication | Configuration value 1 | Configuration value 2 | Configuration value 3 | Condition |
| Wait time | 0 | | Write memory | CORE | INIT | 0xFFFF | 4 | Nop | | | | |
| | | | Write memory | FLASH/las_L5 | 4 | 0 | 1 | Nop | | | | |
| | | | Write memory | FLASH/las_L5 | 5 | 0 | 1 | Nop | | | | |
| | | | Write memory | FLASH/las_L5 | 6 | 0 | 1 | Nop | | | | |
| | | | Write memory | FLASH/las_L5 | 7 | 0 | 1 | Nop | | | | |
| | | | I/O set | Timer/ICAPT_in | 1 | | | Read memory | CORE | vSTATCNT | 4 | > 0x1256 |
| Function Trigger | 1ms_Task | | | | | | | | | | | |

| Trigger item 510 | | | Operation item 520 | | | | | Observation item 530 | | | | |
|---|---|---|---|---|---|---|---|---|---|---|---|---|
| Indication | Configuration value | Condition | Indication | Configuration value 1 | Configuration value 2 | Configuration value 3 | Configuration value 4 | Indication | Configuration value 1 | Configuration value 2 | Configuration value 3 | Condition |
| Wait time | 0 | | Write memory | CORE | INIT | 0xFFFF | 4 | Nop | | | | |
| | | | Write memory | FLASH/las_L5 | 4 | 0 | 1 | Nop | | | | |
| | | | Write memory | FLASH/las_L5 | 5 | 0 | 1 | Nop | | | | |
| | | | Write memory | FLASH/las_L5 | 6 | 0 | 1 | Nop | | | | |
| Function Trigger | start_up | | Write memory | ADC_1/CWSEL0/WSEL_CH7 | 0xF | | | Read memory | CORE | vIGN | 1 | == 1 |
| Function Trigger | 1ms_Task | | I/O set | Timer/ICAPT_in | 1 | | | Read memory | CORE | vSTATCNT | 4 | > 0x1256 |
| 511 | 512 | 513 | 521 | 522 | 522 | 522 | 522 | 531 | 532 | 532 | 532 | 533 |

Fig.8

| Trigger condition wait period #0 | Event period #0 | Trigger condition wait period #1 | Event period #1 | Trigger condition wait period #2 | Event period #2 | Trigger condition wait period #3 | Event period #3 |

COMPUTER SYSTEM, TEST METHOD, AND RECORDING MEDIUM

TECHNICAL FIELD

The present invention relates to a computer system.

BACKGROUND ART

An embedded system is constituted by a mechanism which constitutes a control target, hardware which performs a control operation based on a physical amount received from the mechanism and which outputs a control value to the mechanism, and software which runs on the hardware. For example, an embedded system for controlling an automotive engine is constituted by a mechanism such as an engine that is a control target, an electronic device such as a microcontroller or a microprocessor which performs a control operation and controls the engine or the like, and software which runs on the microcontroller or the microprocessor.

Since behavior of software included in an embedded system strongly depends on a configuration of a mechanism that is a control target and on hardware configuration, an analysis of behavior must be based on a combined consideration of the mechanism, the hardware, and the software.

In recent years, embedded systems are becoming increasingly complex due to higher reliability and higher functionality of automobiles, electric devices, and the like. Consequently, in order to shorten work periods, specialization is performed by subdividing respective hardware and software components and simultaneous development is carried out at a plurality of locations. Progress in specialization not only results in increased operation checks for each component but also in increases of performance deficiency and specification failure which are discovered when assembling the components. As a result, there are frequent occurrences of delays in a development period due to rework in a final stage prior to product shipment and a decline in development efficiency has become a problem.

In order to solve this problem, performance evaluations and verification methods are used at a time point of design by a simulation in which a mechanism, hardware, and software cooperate with one another.

When executing the simulation described above, in addition to connecting models simulating operations of an execution target, a disturbance condition must be inserted to each simulator and a mechanism for observing internal states must be added to each simulator. The insertion of a disturbance condition and the observation of internal states are required to not only occur at a time point determined in advance which precedes the start of a simulation but to be also triggered by a specific state reached by a simulator. This is due to the fact that increased complexity of an entire system results in higher importance of analyses of abnormal states originating in complex mutual relationships that exist among components.

However, a development period is affected by the enormous number of test items for a performance evaluation.

PTL 1 describes, in a case where a plurality of test items have a common input data range with respect to software, consolidating the test items into a single integrated test item to reduce the number of steps related to a test.

CITATION LIST

Patent Literature

[PTL 1]
Japanese Patent Application Publication No. 2009-193488

SUMMARY OF INVENTION

Technical Problem

The technique described in PTL 1 integrates a plurality of test items only when the test items have common input data and, at the same time, the input data has a common range. Therefore, it is difficult to significantly reduce the time required for a test.

Solution to Problem

In order to solve the problem described above, a computer system according to an aspect of the present invention includes a storage device and a processor coupled to the storage device. The processor is configured to: acquire a plurality of test items for a simulation model of a target system, each test item including at least one event; detect a set of test items from the plurality of test items under an aggregation condition in which an event in the set is not dependent on an event in another test item in the set; include a common event, which is an event in the set that is the same as an event in another test item in the set, in an aggregate test item while avoiding overlapping of the common event, and include a unique event, which is an event in the set that differs from events in other test items in the set, in the aggregate test item; and execute a simulation using the simulation model in accordance with the aggregate test item.

Advantageous Effects of Invention

A time required for a test by a simulation model can be reduced.

BRIEF DESCRIPTION OF DRAWINGS

FIG. 3 shows a configuration of an input test item.
FIG. 5 shows a configuration of an aggregate test item.
FIG. 8 shows an operation of the simulation model group 330 in a test item execution process.

DESCRIPTION OF EMBODIMENT

Hereinafter, an embodiment of the present invention will be described with reference to the drawings.

Although information may be described below using expressions such as an "xxx item", information may be expressed using any kind of data structure. In other words, an "xxx item" can also be referred to as "xxx information" in order to show that information is not dependent on data structure. In addition, in the following description, a configuration of each table represents an example and one table may be divided into two or more tables and all of or a part of two or more tables may constitute one table.

In addition, in the following description, while an ID is used as identification information of an element, other types of identification information may be used in place of, or in addition to, an ID.

Furthermore, in the following description, when describing elements of a same type without distinguishing the elements from one another, reference signs or a common number in reference signs may be used. However, when describing elements of a same type by distinguishing the elements from one another, reference signs of the elements may be used or IDs assigned to the elements may be used in place of the reference signs of the elements.

Furthermore, in the following description, input/output (I/O) signifies write or read and may instead be referred to as an access.

In addition, while a "program" is sometimes used as a subject when describing a process in the following description, since a program causes a prescribed process to be performed by appropriately using a storage resource (such as a memory) and/or an interface device (such as a communication port) and the like when being executed by a processor (such as a central processing unit (CPU)), a "processor" may be used instead as a subject of a process. A process described using a program as a subject may be considered a process performed by a processor or by an apparatus including the processor or may be considered a system. Furthermore, a processor may include a hardware circuit which performs a part of or all of a process. A program may be installed in an apparatus such as a computer from a program source. The program source may be, for example, a program distribution server or a computer-readable storage medium. When the program source is a program distribution server, the program distribution server may include a processor (for example, a CPU) and a storage resource, and the storage resource may further store a distribution program and a program that is a distribution target. Furthermore, by having the processor of the program distribution server execute the distribution program, the processor of the program distribution server may distribute the program that is the distribution target to other computers. In addition, in the following description, two or more programs may be realized as one program or one program may be realized as two or more programs.

Figure 1:
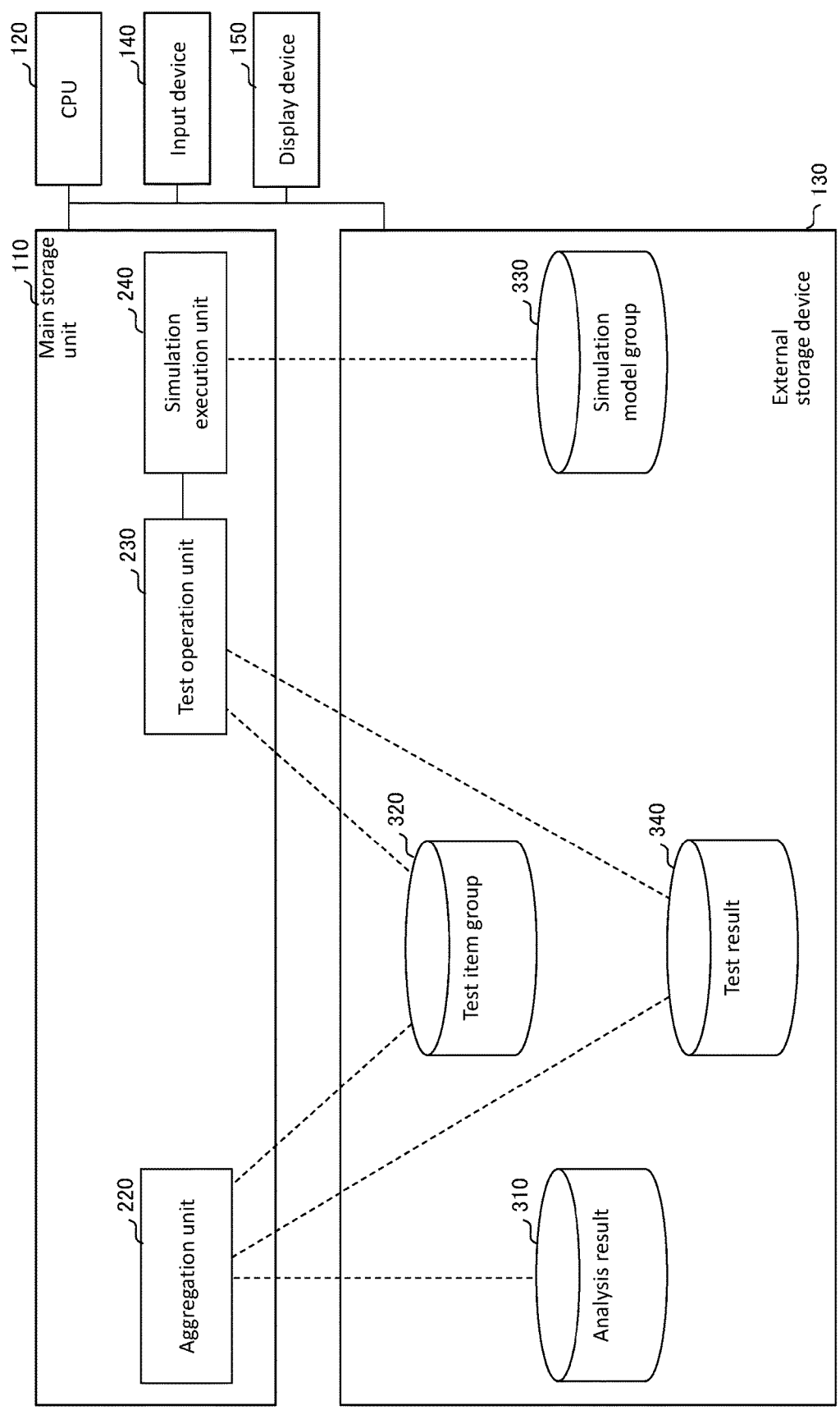
FIG. 1 shows a configuration of a computer system according to a present example.

FIG. 1 shows a configuration of a computer system according to the present example.

The computer system includes a main storage unit 110, a CPU 120, an external storage device 130, an input device 140, and a display device 150.

The main storage unit 110 is a main storage device such as a memory and stores programs and data. The CPU 120 executes a process in accordance with a program stored in the main storage unit 110. The external storage device 130 is an auxiliary storage device such as a hard disk drive (HDD) or a solid state drive (SSD) and stores programs and data. The input device 140 acquires data input by a user. The display device 150 displays data.

The main storage unit 110 stores programs of an aggregation unit 220, a test operation unit 230, and a simulation execution unit 240. The external storage device 130 stores data including an analysis result 310, a test item group 320, a simulation model group 330, and a test result 340. Any of these programs and data may be stored in the main storage unit 110, stored in the external storage device 130, or stored in a storage coupled via a communication network.

The test item group 320 includes a plurality of test items. Each test item includes at least one event. Each event represents at least any of a trigger of an event, an operation with respect to a state of the simulation model group 330, and an observation of the state of the simulation model group 330. Examples of test items include an input test item which is input from the input device 140, an aggregate test item which is obtained by aggregating a plurality of input test items, and a retest item which includes an event to be retested among the aggregate test item. An input test item may be received via a communication network from an external device. The test result 340 includes a determination result list which indicates determination results of events in a test item and a finalized result list which indicates a finalized determination result among determination results of events in the test item.

The analysis result 310 represents an analysis result or an execution result of the simulation model group 330. For example, the analysis result 310 represents a static analysis result of the simulation model group 330 or an execution result of the simulation execution unit 240 using the simulation model group 330. The aggregation unit 220 may perform a static analysis of the simulation model group 330 and acquire a static analysis result. The test operation unit 230 may have the simulation execution unit 240 execute a simulation and may acquire an execution result.

The aggregation unit 220 generates an aggregate test item by aggregating a plurality of input test items included in the test item group 320. The test operation unit 230 controls the simulation execution unit 240 in accordance with a test item. The simulation execution unit 240 executes a simulation using the simulation model group 330.

Figure 2:
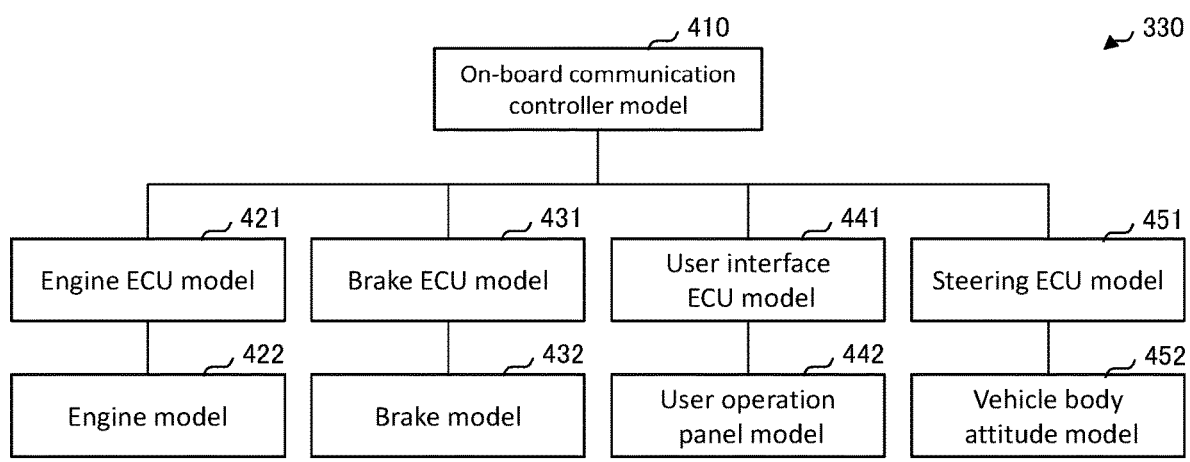
FIG. 2 shows a configuration of a simulation model group 330.

FIG. 2 shows a configuration of the simulation model group 330.

The simulation model group 330 includes a plurality of simulation models representing a target system of a test. A simulation model is, for example, a program representing a model of elements of a target system. Elements include a mechanism, hardware, and software. The target system according to the present example is a control system of an automobile.

The simulation model group 330 according to the present example includes an on-board communication controller model 410 which is a model of an on-board communication controller, an engine ECU model 421 which is a model of an engine electronic control unit (ECU) coupled to the on-board communication controller, an engine model 422 which is a model of an engine coupled to the engine ECU, a brake ECU model 431 which is a model of a brake ECU coupled to the on-board communication controller, a brake model 432 which is a model of a brake coupled to the brake ECU, a user interface ECU model 441 which is a model of a user interface ECU coupled to the on-board communication controller, a user operation panel model 442 which is a model of a user operation panel coupled to the user interface ECU, a steering ECU model 451 which is a model of a steering ECU coupled to the on-board communication controller, and a vehicle body attitude model 452 which is a model of a vehicle body attitude affected by the steering ECU. The configuration of the simulation model group 330 shown in FIG. 2 is an example. The configuration of the simulation model group 330 is not limited to this example.

The plurality of ECUs in the control system are coupled to one another via a communication network such as a control area network (CAN).

The test operation unit 230 or the simulation execution unit 240 may include a probe unit which acquires a state of each unit in the simulation model group 330. The probe unit operates or observes analog values or digital values in the simulation model group 330.

FIG. 3 shows a configuration of an input test item.

FIG. 3 shows input test items 321*a* and 321*b* in the test item group 320. Each input test item includes an entry for each event. An entry of a single event includes a trigger item 510, an operation item 520, and an observation item 530. Each of the operation item 520 and the observation item 530 may not be provided or a plurality of operation items 520 and a plurality of observation items 530 may be provided.

The trigger item 510 includes an indication (or an operation) 511 which indicates a type of a trigger, a configuration value (or an argument) 512 which indicates a state used for the trigger, and a condition 513 which indicates a condition of the trigger. The operation item 520 includes an indication 521 which indicates a type of an operation and a configuration value 522 which indicates an operation target and an operation value. The observation item 530 includes an indication 531 which indicates a type of an observation, a configuration value 532 which indicates an observation target, and a condition 533 which indicates a determination condition of an observation result. Any of the trigger item 510, the operation item 520, and the observation item 530 may not have a value or may include a plurality of values.

For example, in the trigger item 510, when the indication 511 indicates a wait time and the configuration value 512 indicates a value of the wait time, the trigger of this event is that the wait time elapses. For example, in the trigger item 510, when the indication 511 indicates a function trigger, the configuration value 512 indicates a function name, and the condition 513 indicates called, the trigger of this event is that the function represented by the function name is called.

For example, in the operation item 520, when the indication 521 indicates I/O set and the configuration value 522 indicates an output destination and a value, the operation for this event is to output the value to the output destination. For example, in the operation item 520, when the indication 521 indicates write memory and the configuration value 522 indicates an operation target and an operation value, the operation for this event is to write the operation value in a memory that is the operation target.

For example, in the observation item 530, when the indication 531 indicates read memory and the configuration value 532 indicates an observation target, the observation for this event is to read a value from the observation target. Furthermore, in the observation item 530, when the condition 533 indicates a determination condition and the read value satisfies the determination condition, the event is determined to have passed. For example, the indication 531 indicating "Nop" in the observation item 530 means that there is no observation item 530.

An event for which the condition 533 of the observation item 530 is configured may be referred to as a determination event.

The operation item 520 may involve writing data representing a disturbance to a memory. The operation item 520 may indicate transmitting a signal to another model via a communication network. The observation item 530 may indicate receiving a signal from another model via a communication network. The operation item 520 may indicate a destruction operation for simulating a failure of a target system such as stopping a clock or changing frequencies of the clock.

Each entry may include an identifier of an event. Each entry may include an attribute indicating whether or not aggregation can be performed. Each entry may include a plurality of operation items 520 or may include a plurality of observation items 530.

Figure 4:
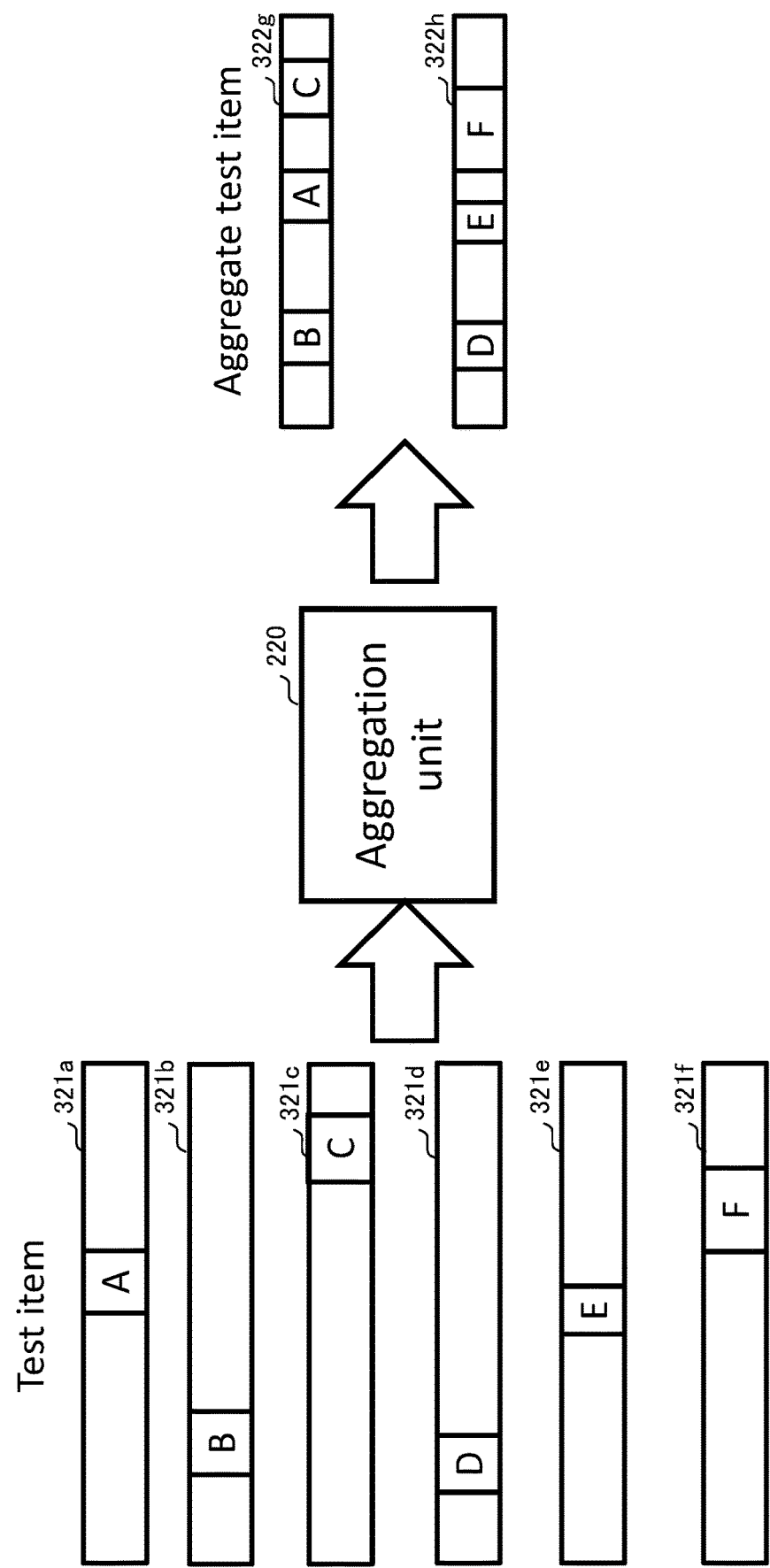
FIG. 4 shows an outline of generation of an aggregate test item.

FIG. 4 shows an outline of generation of an aggregate test item.

The aggregation unit 220 detects a set of input test items satisfying an aggregation condition among the plurality of input test items in the test item group 320. For example, the aggregation condition is a condition in which an event in each input test item in the set is not dependent on an event in another input test item in the set. In addition, the aggregation unit 220 considers a completely matching event among a plurality of input test items in the set to be a common event, considers an event other than a common event to be a unique event, and generates one aggregate test item by eliminating overlapping of common events and arranging common events and unique events in an order of execution time points.

In the example shown in FIG. 4, the aggregation unit 220 generates a first set including an input test item 321*a* having a unique event A, an input test item 321*b* having a unique event B, and an input test item 321*c* having a unique event C, and generates a second set including an input test item 321*d* having a unique event D, an input test item 321*e* having a unique event E, and an input test item 321*f* having a unique event F. In addition, the aggregation unit 220 generates an aggregate test item 322*g* by arranging the common events and the unique events in the first set in an order of triggers and generates an aggregate test item 322*h* by arranging the common events and the unique events in the second set in an order of triggers.

FIG. 5 shows a configuration of an aggregate test item.

FIG. 5 shows an aggregate test item 322*r* obtained by aggregating input test items 321*p* and 321*q*. A configuration of an aggregate test item is similar to that of an input test item. Moreover, both an input test item and an aggregate test item may be referred to as a test item.

In the aggregate test item 322*r*, each event from number 1 to number 5 is a common event and completely matches between the two input test items 321*p* and 321*q*. A sixth event is a unique event of the input test item 321*p* and a seventh event is a unique event of the input test item 321*q*.

When using the two input test items 321*p* and 321*q*, a second test is performed with respect to the common events numbers 1 to 5. When using the aggregate test item 322*r*, only one test is performed with respect to the common events numbers 1 to 5. In this manner, by aggregating a plurality of input test items into an aggregate test item, the number of tests with respect to common events in the plurality of input test items can be reduced and overall test time can be shortened.

Hereinafter, operations of the computer system will be described.

The computer system performs a test process with an aim to have all determination events among all input test items pass.

Figure 6:
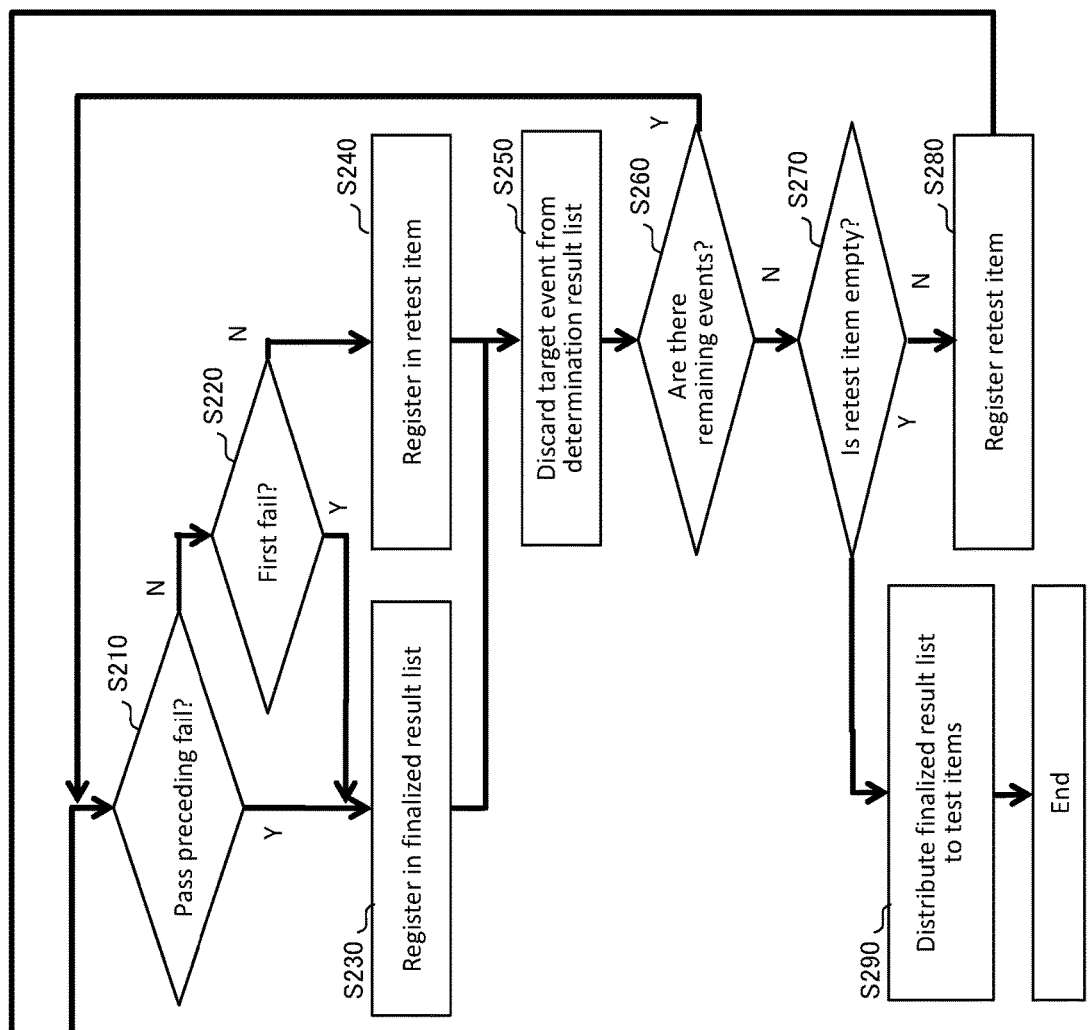
FIG. 6 shows a test process.

FIG. 6 shows a test process.

In S110, the aggregation unit 220 acquires a plurality of input test items input to the input device 140 and registers the plurality of input test items in the test item group 320.

In S120, based on the analysis result 310, the aggregation unit 220 analyzes an estimated ignition time point of a trigger item of an event in the plurality of input test items in the test item group 320. An estimated ignition time point is a predicted value of a time point at which the trigger item 510 ignites at a simulation time point. An estimated ignition time point may be a predicted value of an execution time point of an event.

In S130, based on an analysis result of the simulation model group 330, the aggregation unit 220 analyzes an active range of an operation item of each event in the plurality of input test items in the test item group 320. An active range is a range affected by an operation item. For example, an active range is an operation target indicated by the configuration value 522 and is an address range of a memory written by an operation, a name of a signal used in communication by an operation, or the like.

In S140, the aggregation unit 220 divides the plurality of input test items into a plurality of sets by detecting sets of a plurality of input test items satisfying an aggregation condition in the plurality of input test items. For example, the aggregation condition is a requirement that an estimated ignition time point of an event in a set does not overlap with an estimated ignition time point of an event in another input test item in the set. Alternatively, the aggregation condition may be a requirement that an active range of an event in a set does not overlap with an active range of an event in another input test item in the set. Alternatively, the aggregation condition may be a requirement that, when an input test item in a set includes an event of a destruction operation, an event of a destruction operation is not included in another input test item in the set. Alternatively, the aggregation condition may be a requirement that, when an input test item in a set includes a communication operation and another input test item in the set includes a communication operation, contents of the communication operations differ from each other.

In S150, the aggregation unit 220 generates an aggregate test item by arranging a plurality of events in the set in an order of estimated ignition time points and aggregating the arranged events into one test item, and registers the aggregate test item in an execution test item group. Accordingly, the test operation unit 230 can execute events in the aggregate test item in accordance with an execution order of corresponding events in the respective input test items. At this point, the aggregation unit 220 associates, with the aggregate test item, input test items in the set which correspond to the aggregate test item. At this point, the aggregation unit 220 may register input test items which have not been aggregated in the execution test item group.

In S160, the test operation unit 230 sequentially selects test items from the execution test item group as target test items and acquires a determination result list of each test item by executing a test item execution process with respect to a target test item. A determination result list includes a determination result of each determination event. Accordingly, the test operation unit 230 can perform verification in an order of simulation time points of determination results of each determination event.

In S170, the test operation unit 230 selects a top event in the determination result list as a target event and determines whether or not a determination result of the target event satisfies a nonaggregable condition. At this point, when a determination result of the target event by the current test item execution process differs from a determination result of the target event by a previous test item execution process, the test operation unit 230 determines that the target event satisfies a nonaggregable condition. For example, when the target event is determined to have passed in the current determination result list, there is a finalized result list including the target event, and the target event is determined to have failed in the finalized result list, the test operation unit 230 determines that the target event satisfies a nonaggregable condition.

When the result of S170 is yes, in S180, the test operation unit 230 discards a determination result related to the target test item and configures a nonaggregable attribute with respect to input test items in the set which correspond to the target test item.

In S190, the test operation unit 230 warns a user that there is a suspicion of multi-point failure and causes the process to make a transition to S210. At this point, the test operation unit 230 causes the display device 150 to display a warning. Subsequently, the aggregation unit 220 does not aggregate an input test item having a nonaggregable attribute and the test operation unit 230 executes a test item execution process with the input test item as a target test item. Accordingly, the test operation unit 230 can improve accuracy of the test.

When the result of S170 is no, in S210, the test operation unit 230 determines whether or not the determination result of the target event is a pass preceding the fail in the target test item.

When the result of S210 is yes, in S230, the test operation unit 230 registers the target event and the determination result thereof in the finalized result list and causes the process to make a transition to S250.

When the result of S210 is no, in S220, the test operation unit 230 determines whether or not the determination result of the target event is a first fail in the target test item.

When the result of S220 is yes, the test operation unit 230 causes the process to make a transition to S230.

When the result of S220 is no, in S240, the test operation unit 230 registers the target event in the retest item and causes the process to make a transition to S250. Accordingly, the test operation unit 230 can retest a determination event of which a determination result has not been finalized.

In addition, the test operation unit 230 may register an event satisfying a prescribed retest condition in the retest item. For example, an event satisfying the retest condition is a determination event of which a target event occurs after a determination event having a failed determination result among determination events in the target test item. Alternatively, an event satisfying the retest condition may be an event preceding the target event in the target test item or an input test item corresponding to the target event.

In S250, the test operation unit 230 discards the target event from the determination result list.

In S260, the test operation unit 230 determines whether or not there are remaining events in the determination result list.

When the result of S260 is yes, the test operation unit 230 causes the process to make a transition to S210.

When the result of S260 is no, in S270, the test operation unit 230 determines whether or not the retest item is empty.

When the result of S270 is no, in S280, the test operation unit 230 registers the retest item in the execution test item group and causes the process to make a transition to S120.

When the result of S270 is yes, in S290, the test operation unit 230 creates a determination result for each input test item based on the finalized result list and ends this flow. In this case, the test operation unit 230 creates a determination result for each input test item by sequentially selecting events in the finalized result list as target events, specifying an input test item corresponding to the target event, and registering a determination result of the target event in a determination result of the specified input test item.

Figure 7:
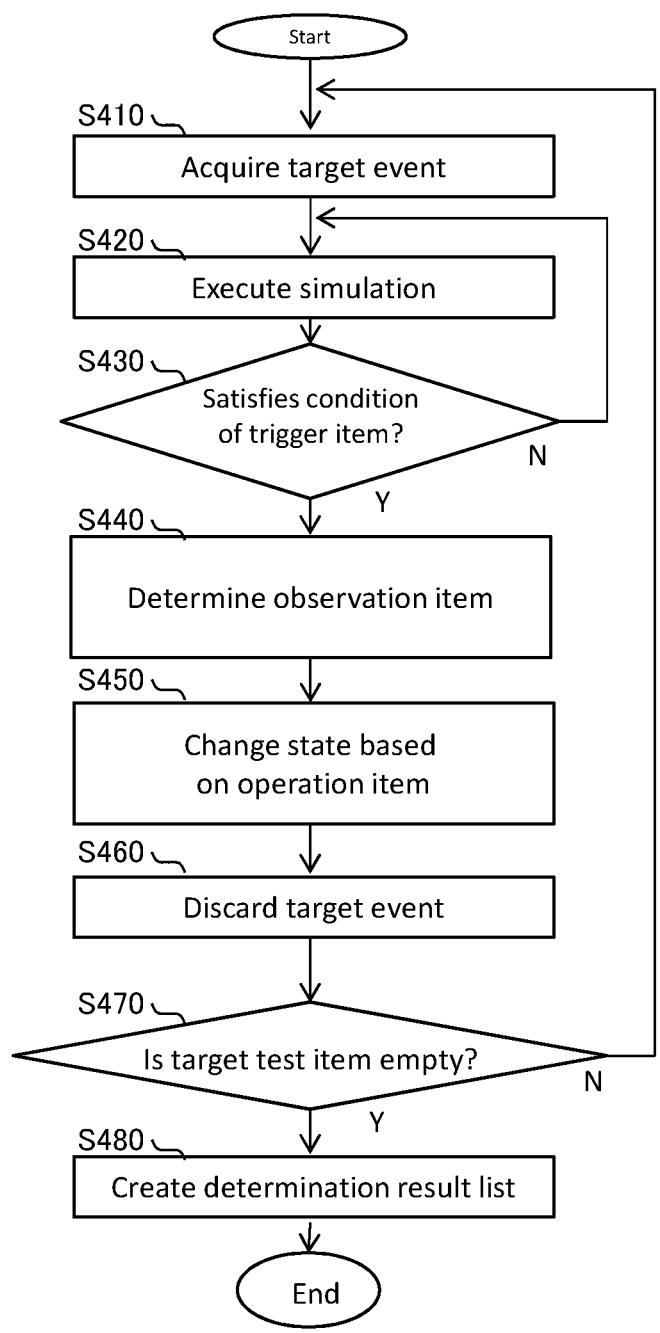
FIG. 7 shows a test item execution process.

FIG. 7 shows a test item execution process.

In S410, the test operation unit 230 sequentially acquires events from the top of the target test item as target events.

In S420, the test operation unit 230 advances a simulation time point by a unit time set in advance and causes the simulation execution unit 240 to execute a simulation. The simulation execution unit 240 executes a simulation corresponding to the unit time using the simulation model group 330 in accordance with the lapse of the simulation time point, and stops the simulation.

In S430, the test operation unit 230 determines whether or not a state of the simulation model group 330 satisfies the condition 513 of the trigger item 510 of the target event.

When the result of S430 is no, the test operation unit 230 causes the process to make a transition to S420.

When the result of S430 is yes, in S440, if the observation item 530 is configured with respect to the target event, the test operation unit 230 acquires a state represented by the indication 531 and the configuration value 532 of the observation item from the simulation model group 330. Furthermore, when the condition 533 of the observation item is configured, the test operation unit 230 determines whether or not the acquired state satisfies the condition and registers a determination result of the target event in the determination result list.

In S450, when the operation item 520 is configured with respect to the target event, the test operation unit 230 changes a state represented by the indication 521 and the configuration value 522 of the operation item in accordance with the configuration value 522.

In S460, the test operation unit 230 discards the target event from the target test item.

In S470, the test operation unit 230 determines whether or not the target test item is empty.

When the result of S470 is no, the test operation unit 230 causes the process to make a transition to S410.

When the result of S470 is yes, in S480, the test operation unit 230 outputs a determination result list of the target test item and ends this flow.

FIG. 8 shows an operation of the simulation model group 330 in a test item execution process.

Periods of a test item execution process include, in an order of simulation time points, a trigger condition wait period #0, an event period #0, a trigger condition wait period #1, an event period #1, a trigger condition wait period #2, an event period #2, a trigger condition wait period #3, and an event period #3. For example, the trigger condition wait period #0 is a period until a state of the simulation model group 330 satisfies a condition of the trigger item 510 of a top event in the target test item. The event period #0 is a period in which the event is executed.

When a determination result of a given event is fail in a determination result list obtained by the test item execution process described above, a determination result of an event subsequent to the given event is not guaranteed.

Next, a working effect of the present example will be described using, as a comparative example, a technique for integrating a plurality of test items as one integrated test item when the plurality of test items have a common input data range.

When a plurality of test items have a same type of input data and ranges of values of the input data overlap each other, the comparative example can integrate the test items. For example, the comparative example can integrate, as one integrated test item, a test item for inputting a value equal to or larger than 100 as a vehicle speed, a test item for inputting a value equal to or larger than 80 and equal to or less than 120 as a vehicle speed, and a test item for inputting a value equal to or less than 120 as a vehicle speed. In addition, for example, the comparative example can integrate, as one integrated test item, a test item for inputting a value equal to or less than 4 MPa as brake hydraulic pressure, a test item for inputting a value equal to or larger than 2 MPa as brake hydraulic pressure, and a test item for inputting a value equal to or larger than 1 MPa as brake hydraulic pressure.

The aggregation unit 220 according to the present example is capable of aggregating a plurality of test items having mutually different types of events. The aggregation unit 220 according to the present example is capable of aggregating a larger number of test items than the comparative example and, consequently, a greater effect of reducing test time is produced.

The storage device corresponds to the main storage unit 110, the external storage device 130, and the like. The processor corresponds to the CPU 120 and the like. The simulation model corresponds to a simulation model, the simulation model group 330, and the like.

While an embodiment of the present invention has been described above, it is to be understood that the described embodiment merely represents an example for illustrating the present invention and the scope of the present invention is not limited to the configuration described above. The present invention can be implemented in various other modes.

REFERENCE SIGNS LIST

110 Main storage unit
120 CPU
130 External storage device
140 Input device
150 Display device
220 Aggregation unit
230 Test operation unit
240 Simulation execution unit
310 Analysis result
320 Test item group
330 Simulation model group
340 Test result

The invention claimed is:

1. A computer system comprising:
a storage device; and
a processor coupled to the storage device, wherein the processor is configured to:
acquire a plurality of test items for a simulation model of a target system, each test item including at least one event;
determine a set of test items, among the plurality of test items, such that each test item in the set satisfies an aggregation condition in which respective events included in each test item in the set are not dependent on respective other events included in other test items in the set;
determine two or more events included in the set of test items that are matching events as common events and determine one or more events included in the set of test items other than the common events as unique events;
generate an aggregate test item that includes only one of the determined common events and all of the determined unique events, and arrange the common event and the unique events in the aggregate test item according to an order of execution of the common event and the unique event; and execute a simulation using the simulation model in accordance with the order of execution of the common event and the unique events in the aggregate test item.

2. A computer system according to claim 1, wherein the processor is configured to:

predict the order of execution of each event in the plurality of test items based on the simulation model.

3. A computer system according to claim 2, wherein each test item includes a determination event indicating a determination condition of a state of the simulation model, and the processor is configured to obtain a determination result of a plurality of determination events in the aggregate test item by executing the simulation to determine a state of the simulation model using the determination condition.

4. A computer system according to claim 3, wherein the processor is configured to register, in a retest item, an event satisfying a prescribed retest condition among the plurality of determination events, and execute a simulation using the simulation model in accordance with the retest item.

5. A computer system according to claim 4, wherein the event satisfying the retest condition is a determination event which occurs after a determination event having a failed determination result, among the plurality of determination events.

6. A computer system according to claim 5, wherein the processor causes a display device to display a warning when a determination result of a determination event in the aggregate test item differs from a determination result of the same determination event by a past simulation.

7. A computer system according to claim 5, wherein the processor executes a simulation using the simulation model in accordance with each test item in the set when a determination result of a determination event in the aggregate test item differs from a determination result of the same determination event by a past simulation.

8. A computer system according to claim 2, wherein the aggregation condition requires that an execution time point of an event in the set does not overlap with an execution time point of an event in another test item in the set.

9. A computer system according to claim 8, wherein each event in the plurality of test items includes at least any of a trigger of the event, an operation with respect to a state of the simulation model, and an observation of the state of the simulation model.

10. A computer system according to claim 9, wherein the aggregation condition requires that a target of an operation of an event in the set does not overlap with a target of an operation of an event in another test item in the set.

11. A computer system according to claim 1, wherein the processor is configured to generate a determination result of each test item in the set by allocating a determination result of a plurality of determination events to a determination result of a corresponding test item.

12. A test method, comprising:

acquiring a plurality of test items for a simulation model of a target system, each test item including at least one event;

determining a set of test items, from among the plurality of test items, such that each test item in the set satisfies an aggregation condition in which respective events included in each test item in the set are not dependent on respective other events included in other test items in the set;

determining two or more events included in the set of test items that are matching events as common events and determining one or more events included in the set of test items other than the common events as unique events;

generating an aggregate test item that includes only one of the determined common events and all of the determined unique events, and arranging the common event and the unique events in the aggregate test item according to an order of execution of the common event and the unique event; and executing a simulation using the simulation model in accordance with the order of execution of the common event and the unique events in the aggregate test item.

13. A computer-readable recording medium storing a program for causing a computer to execute a process, the process comprising:

acquiring a plurality of test items for a simulation model of a target system, each test item including at least one event;

determining a set of test items, among the plurality of test items, such that each test item in the set satisfies an aggregation condition in which respective events included in each test item in the set are not dependent on respective other events included in other test items in the set;

determining two or more events included in the set of test items that are matching events as common events and determining one or more events included in the set of test items other than the common events as unique events;

generating an aggregate test item that includes only one of the determined common events and all of the determined unique events, and arranging the common event and the unique events in the aggregate test item according to an order of execution of the common event and the unique event; and executing a simulation using the simulation model in accordance with the order of execution of the common event and the unique events in the aggregate test item.

* * * * *